US012757692B2

(12) United States Patent
Chen

(10) Patent No.: US 12,757,692 B2
(45) Date of Patent: Oct. 6, 2026

(54) SEMICONDUCTOR DEVICE WITH CATALYTIC CONDUCTIVE LAYER AND METHOD FOR FABRICATING THE SAME

(71) Applicant: NANYA TECHNOLOGY CORPORATION, New Taipei City (TW)

(72) Inventor: Wei-Yu Chen, Houlong Twonship (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 381 days.

(21) Appl. No.: 18/401,760

(22) Filed: Jan. 2, 2024

(65) Prior Publication Data

US 2025/0218859 A1 Jul. 3, 2025

(51) Int. Cl.

| | |
|---|---|
| ***H10W 10/00*** | (2026.01) |
| ***H10P 14/40*** | (2026.01) |
| ***H10P 50/26*** | (2026.01) |
| ***H10P 50/64*** | (2026.01) |
| ***H10W 10/17*** | (2026.01) |
| ***H10W 20/00*** | (2026.01) |

(52) U.S. Cl.

CPC ......... *H10W 10/014* (2026.01); *H10P 14/412* (2026.01); *H10P 50/266* (2026.01); *H10P 50/644* (2026.01); *H10W 10/17* (2026.01); *H10W 20/089* (2026.01)

(58) Field of Classification Search

CPC .................................................. H10W 10/014

USPC ......................................................... 438/424

See application file for complete search history.

(56) References Cited

U.S. PATENT DOCUMENTS

| | | | | |
|---|---|---|---|---|
| 2012/0088372 | A1 | 4/2012 | Chien et al. | |
| 2013/0045562 | A1* | 2/2013 | Liu | H10F 71/121 438/72 |
| 2014/0252615 | A1* | 9/2014 | Saito | H10W 20/4462 438/610 |
| 2018/0090336 | A1* | 3/2018 | Li | H10P 50/242 |
| 2019/0221438 | A1 | 7/2019 | Li et al. | |

FOREIGN PATENT DOCUMENTS

| | | | |
|---|---|---|---|
| TW | 201216348 | A | 4/2012 |
| TW | 202245048 | A | 11/2022 |
| TW | 202318486 | A | 5/2023 |

(Continued)

OTHER PUBLICATIONS

Office Action and and the search report mailed on Jan. 21, 2025 related to Taiwanese Application No. 113141217.

(Continued)

*Primary Examiner* — Ajay Arora

(74) *Attorney, Agent, or Firm* — Xuan Zhang

(57) ABSTRACT

The present application discloses a semiconductor device and a method for fabricating the semiconductor device. The semiconductor device includes a substrate; an indentation inwardly positioned in the substrate and including a bottom surface and two sidewalls; a catalytic conductive layer positioned on the bottom surface of the indentation. The bottom surface of the indentation and a top surface of the substrate are parallel to each other. The two sidewalls of the indentation are substantially vertical.

11 Claims, 19 Drawing Sheets

(56) References Cited

FOREIGN PATENT DOCUMENTS

| | | |
|---|---|---|
| TW | 202401581 A | 1/2024 |
| TW | 202401602 A | 1/2024 |

OTHER PUBLICATIONS

Summary translation of Office Action and and the search report mailed on Jan. 21, 2025 related to Taiwanese Application No. 113141217 and Feb. 5, 2025 related to Taiwanese Application No. 113110453.

Office Action and and the search report mailed on Feb. 5, 2025 related to Taiwanese Application No. 113110453.

Office Action and and the search report mailed on Apr. 25, 2025 related to Taiwanese Application No. 113110453.

Summary translation of Office Action and and the search report mailed on Apr. 25, 2025 related to Taiwanese Application No. 113110453.

* cited by examiner

SEMICONDUCTOR DEVICE WITH CATALYTIC CONDUCTIVE LAYER AND METHOD FOR FABRICATING THE SAME

TECHNICAL FIELD

The present disclosure relates to a semiconductor device and a method for fabricating the semiconductor device, and more particularly, to a semiconductor device with a catalytic conductive layer and a method for fabricating the semiconductor device with the catalytic conductive layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; an indentation inwardly positioned in the substrate and comprising a bottom surface and two sidewalls; a catalytic conductive layer positioned on the bottom surface of the indentation. The bottom surface of the indentation and a top surface of the substrate are parallel to each other. The two sidewalls of the indentation are substantially vertical.

Another aspect of the present disclosure provides a semiconductor device including a substrate; a first trench inwardly positioned in the substrate and comprising a bottom surface and two sidewalls; a catalytic conductive layer positioned on the bottom surface of the first trench; wherein the bottom surface of the indentation and a top surface of the substrate are parallel to each other. The two sidewalls of the first trench are substantially vertical. An aspect ratio of the first trench is between about 4:1 and about 12:1.

Another aspect of the present disclosure provides a method for fabricating a semiconductor device including providing a substrate; forming a catalytic conductive layer on the substrate; patterning the catalytic conductive layer to form an opening exposing an exposed portion of the substrate, while leaving a covered portion of the substrate covered by the catalytic conductive layer; performing a trench-etching process to recess the covered portion of the substrate, resulting in a first trench; removing the catalytic conductive layer; and forming an isolation layer in the first trench.

Due to the design of the semiconductor device of the present disclosure, the trench-etching process utilizing the catalytic conductive layer does not generate massive by-products. Consequently, this eliminates the need for intensive cleaning post-processing, thereby reducing both the cost and complexity involved in fabricating the semiconductor device.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
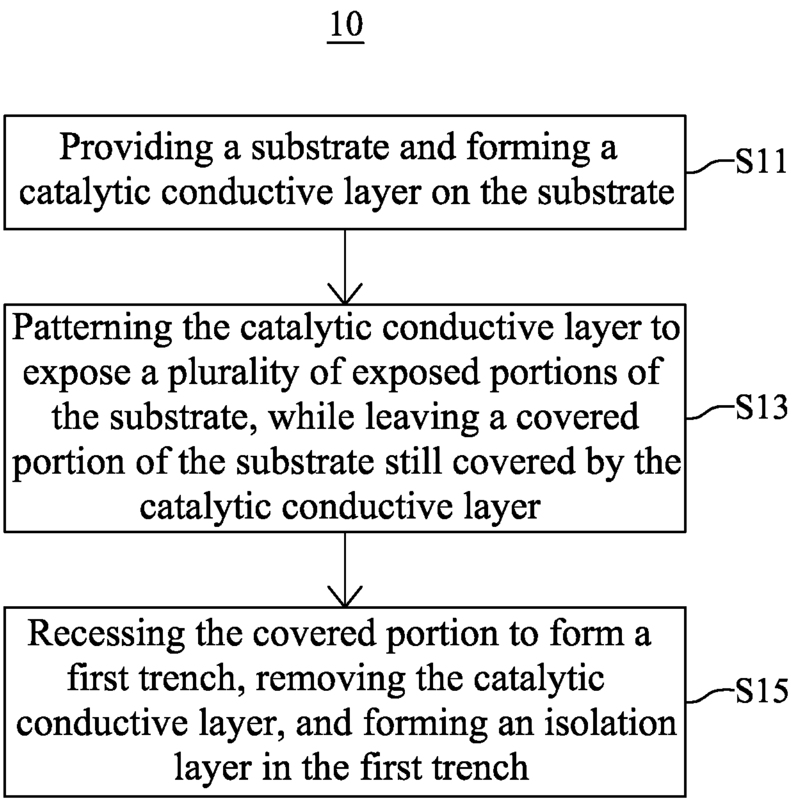
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
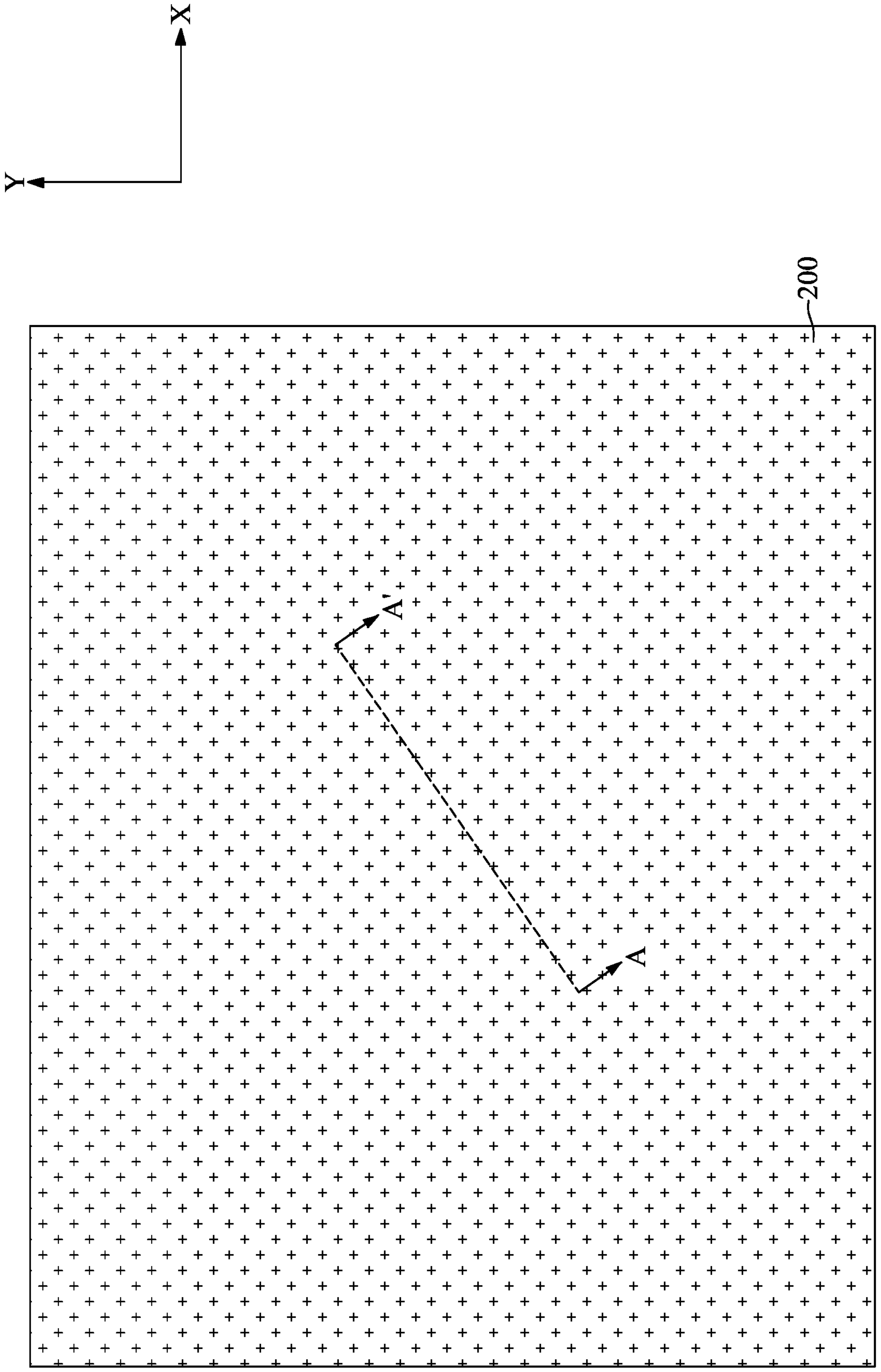
FIG. 2 illustrates, in a schematic top-view diagram, an intermediate semiconductor device in accordance with one embodiment of the present disclosure.
Figure 3:
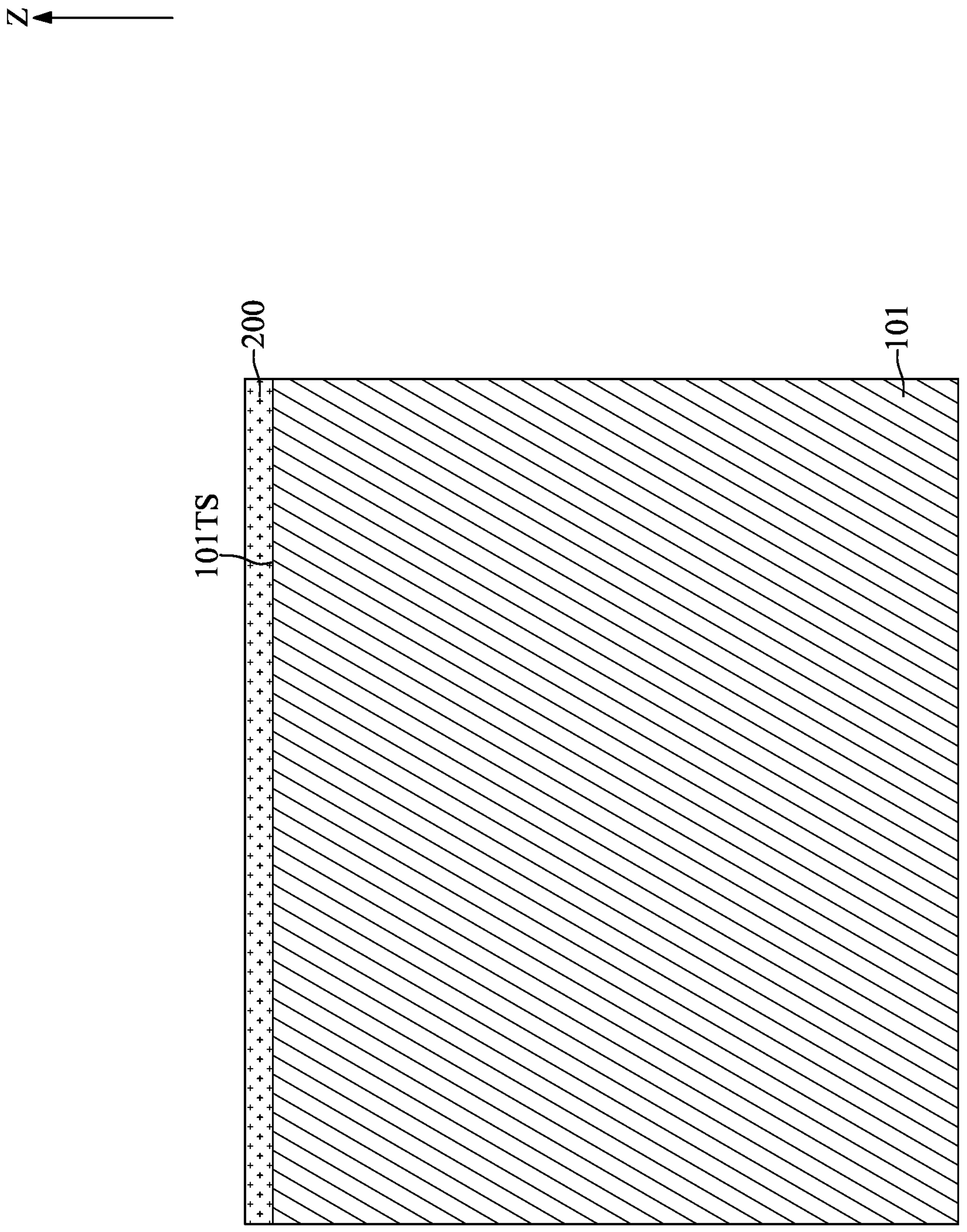
FIG. 3 is a schematic cross-sectional view diagram taken along a line A-A' in FIG. 2 illustrating part of a flow for fabricating the semiconductor device in accordance with one embodiment of the present disclosure.

FIG. 1 illustrates, in a flowchart diagram form, a method 10 for fabricating a semiconductor device 1A in accordance with one embodiment of the present disclosure. FIG. 2 illustrates, in a schematic top-view diagram, an intermediate semiconductor device in accordance with one embodiment of the present disclosure. FIG. 3 is a schematic cross-sectional view diagram taken along a line A-A' in FIG. 2 illustrating part of a flow for fabricating the semiconductor device 1A in accordance with one embodiment of the present disclosure.

With reference to FIGS. 1 to 3, at step S11, a substrate 101 may be provided and a catalytic conductive layer 200 may be formed on the substrate 101.

With reference to FIGS. 2 and 3, in some embodiments, the substrate 101 may be formed of, for example, silicon, germanium, silicon germanium, silicon carbon, silicon germanium carbon, gallium, gallium arsenide, indium arsenide, indium phosphorus, or other IV-IV, III-V or II-VI semiconductor materials. In some embodiments, the substrate 101 may be formed of, for example, InSb, GaN, GaP, GaSb, GaAsP, GaAsN, GaInAs, GaInP, AlGaAs, AlGaIn, AlGaP, AlGaInP, InGaAs, InGaN, InGaP, InGaSb, InAsSb, AlN, AlGaN, ZnSe, diamond (C), or $Ga_2O_3$. In some embodiments, the substrate 101 may be doped with various types of dopants, such as, but not limited to, boron, aluminum, gallium, indium, arsenic, or phosphorus.

In some embodiments, the substrate 101 may include an organic semiconductor or a layered semiconductor such as silicon/silicon germanium, silicon-on-insulator, or silicon germanium-on-insulator. When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride, or any combination thereof.

In some embodiments, the crystal orientation of the substrate 101 (or the top semiconductor layer) may be <100>, <110>, or <111>. In the present embodiment, the substrate 101 may be formed of silicon.

With reference to FIGS. 2 and 3, the catalytic conductive layer 200 may be formed on the top surface 101TS of the substrate 101. During the current stage, the top surface 101TS may be completely covered by the catalytic conductive layer 200. In some embodiments, the catalytic conductive layer 200 may be formed of, for example, a noble metal such as silver or gold. In some embodiments, the catalytic conductive layer 200 may be formed of, for example, Schottky metals. In some embodiments, the catalytic conductive layer 200 may be formed of, for example, silver, gold, cobalt, chromium, copper, iron, hafnium, iridium, manganese, molybdenum, palladium, platinum, rubidium, rhenium, rhodium, tantalum, titanium, vanadium, tungsten, zinc, or zirconium. In some embodiments, the catalytic conductive layer 200 may be formed of, for example, aluminum, titanium, nickel, iron, zinc, cadmium, indium, tin, antimony, tellurium, lead, bismuth, vanadium, chromium, manganese, ruthenium, molybdenum, or other transition metals. In some embodiments, the catalytic conductive layer 200 may be formed of, for example, titanium nitride.

In some embodiments, the catalytic conductive layer 200 may be formed by, for example, sputtering, physical vapor deposition, electroplating, electroless plating, atomic layer deposition, or other applicable deposition processes. In some embodiments, the process pressure for depositing the catalytic conductive layer 200 may be between about 2 mTorr and about 20 mTorr. In some embodiments, the process pressure for depositing the catalytic conductive layer 200 may be about 5 mTorr. In some embodiments, the thickness of the catalytic conductive layer 200 may be between about 1 nm and about 100 nm. In some embodiments, thickness of the catalytic conductive layer 200 may be between about 2 nm and about 20 nm.

In some embodiments, a planarization process, such as chemical mechanical polishing, may be optionally performed to provide a substantially flat surface for subsequent processing steps.

Figure 4:
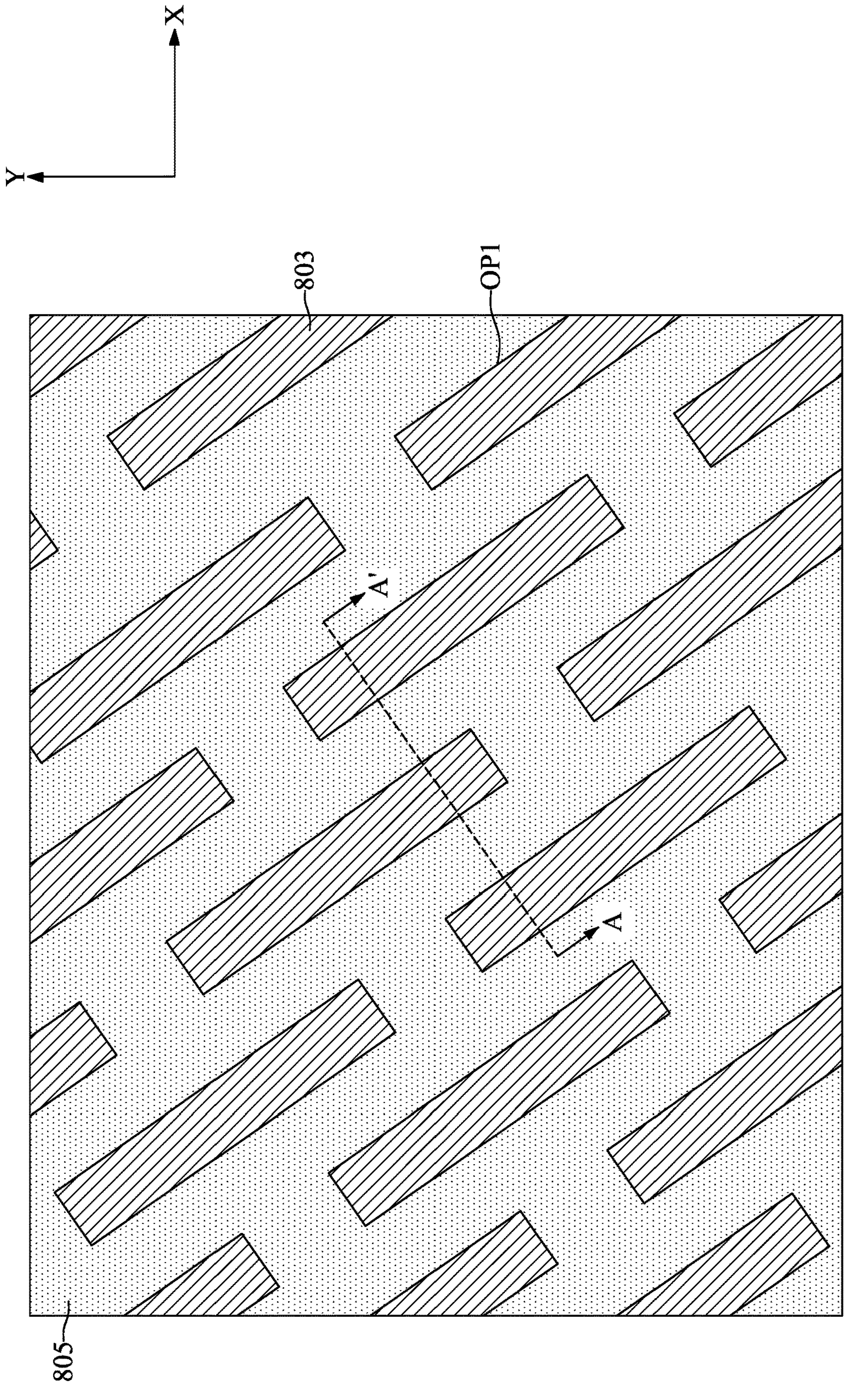
FIG. 4 illustrates, in a schematic top-view diagram, an intermediate semiconductor device in accordance with one embodiment of the present disclosure.
Figure 5:
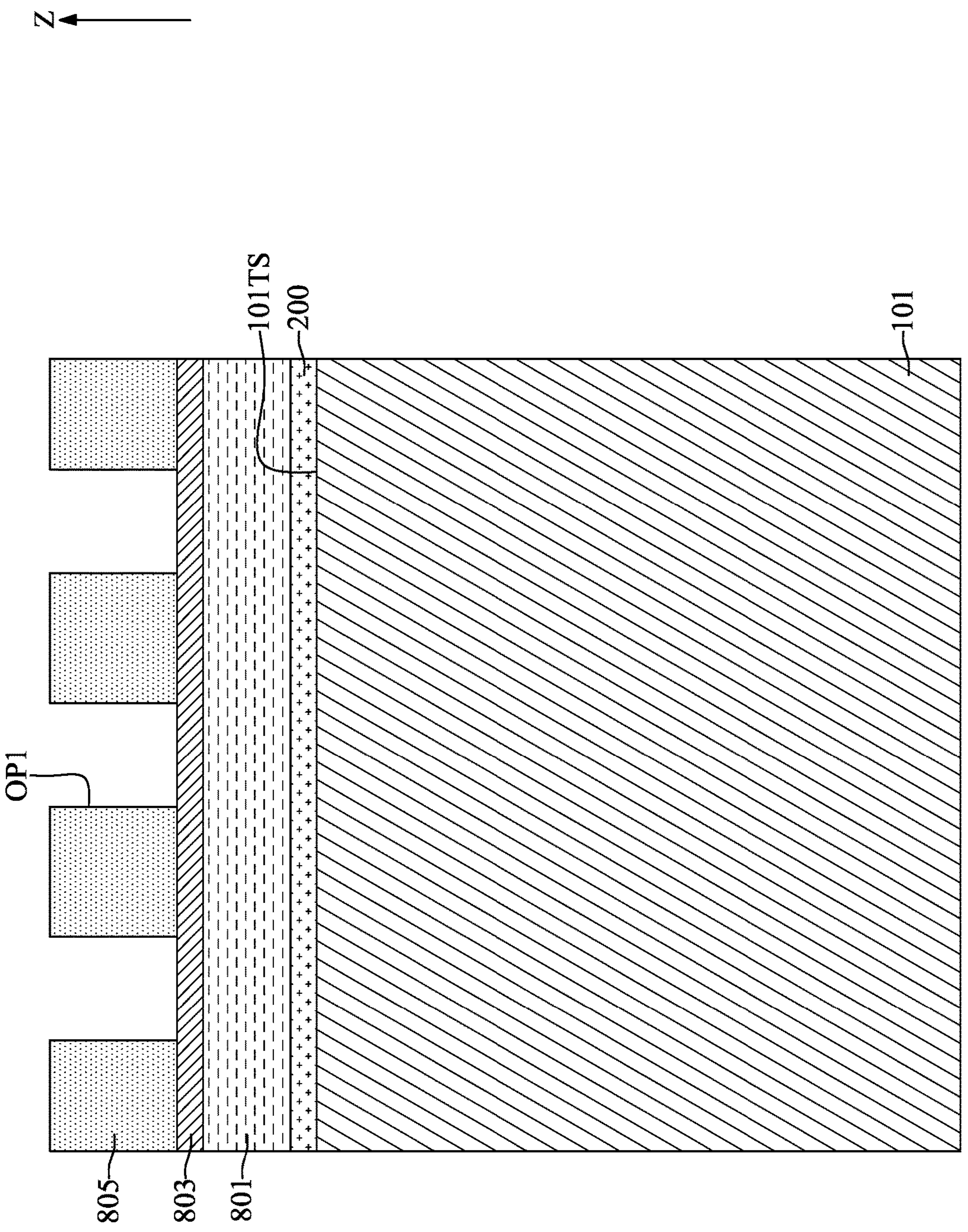
FIG. 5 is a schematic cross-sectional view diagram taken along a line A-A' in FIG. 4 illustrating part of the flow for fabricating the semiconductor device in accordance with one embodiment of the present disclosure.
Figure 6:
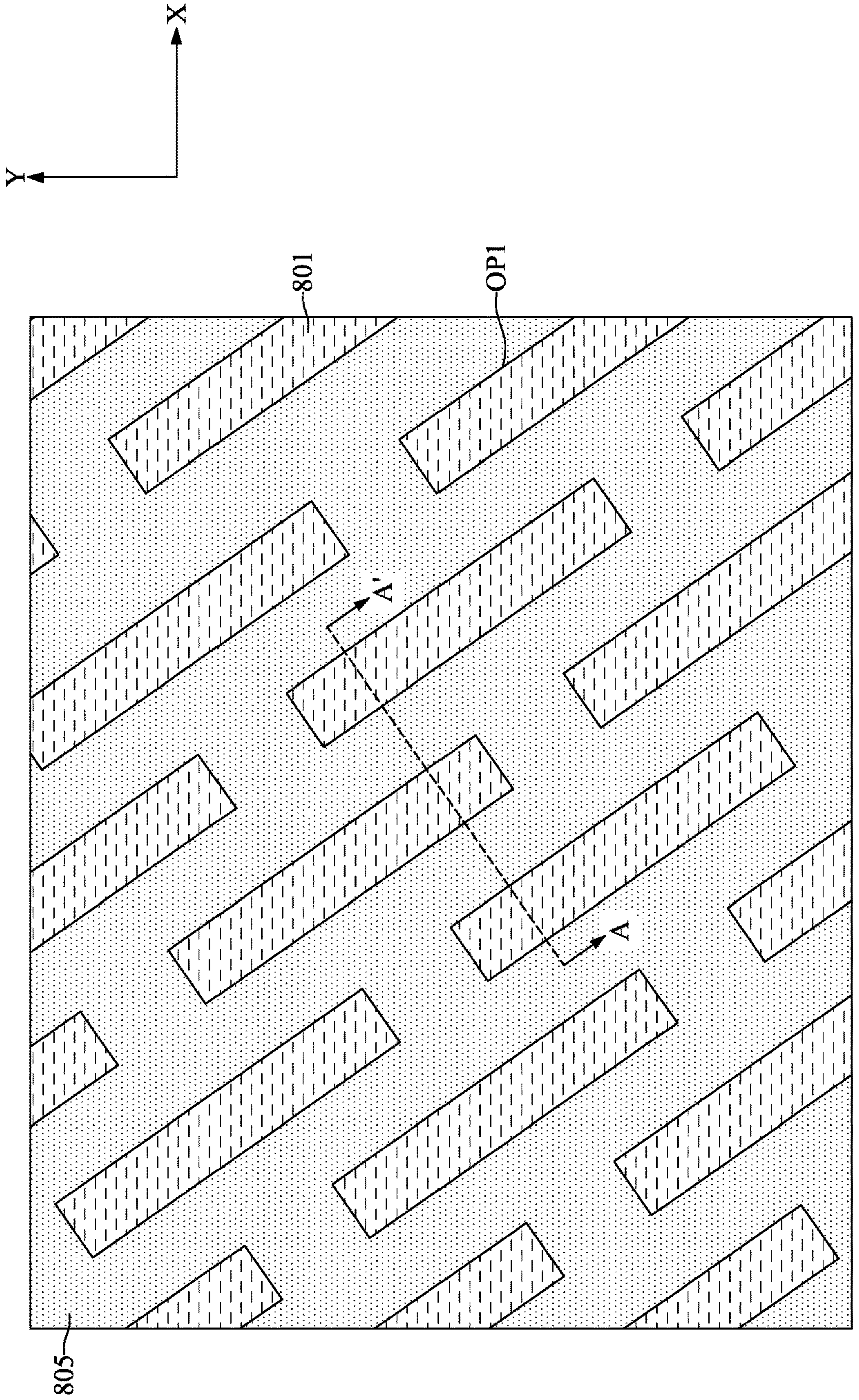
FIG. 6 illustrates, in a schematic top-view diagram, an intermediate semiconductor device in accordance with one embodiment of the present disclosure.
Figure 7:
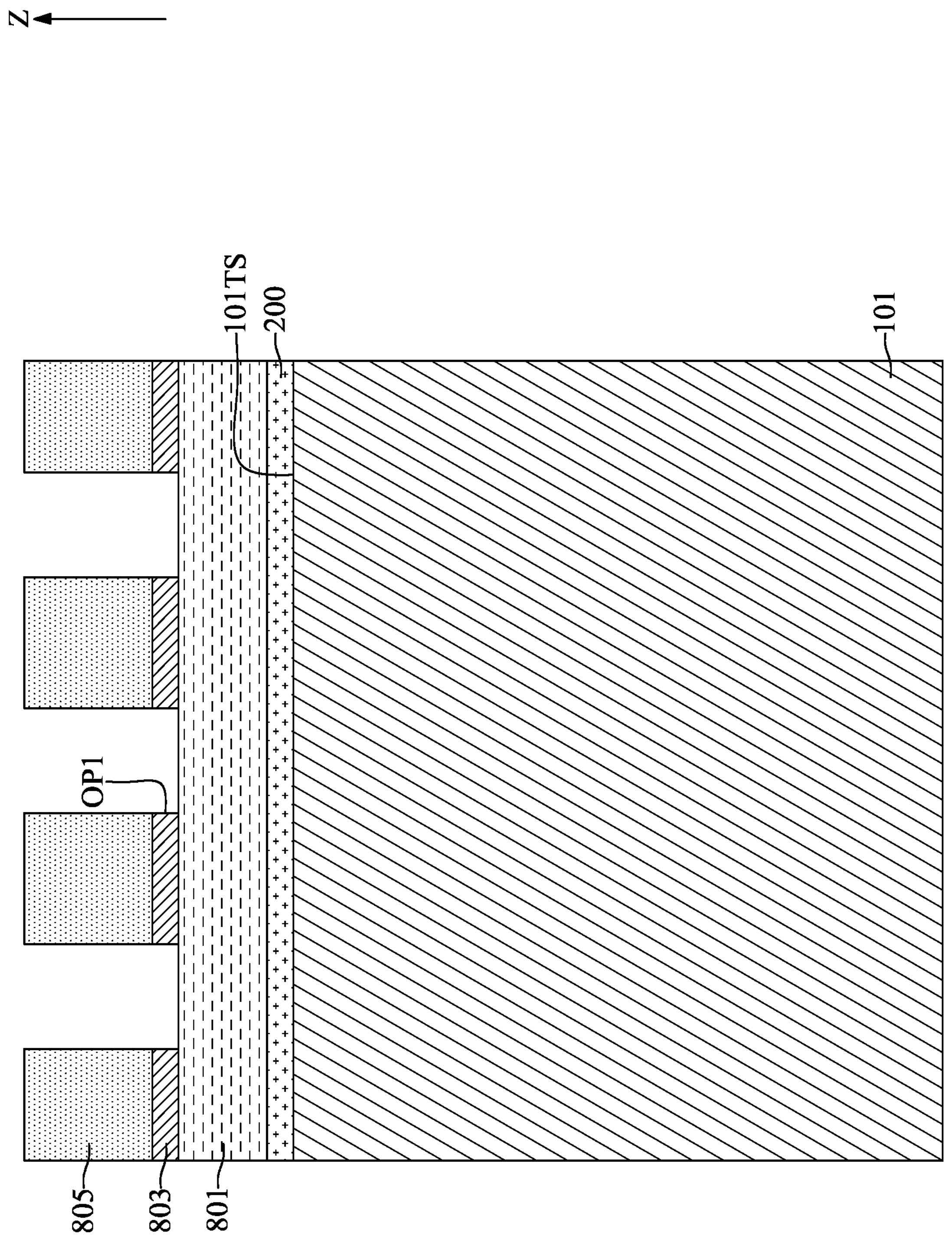
FIG. 7 is a schematic cross-sectional view diagram taken along a line A-A' in FIG. 6 illustrating part of the flow for fabricating the semiconductor device in accordance with one embodiment of the present disclosure.
Figure 8:
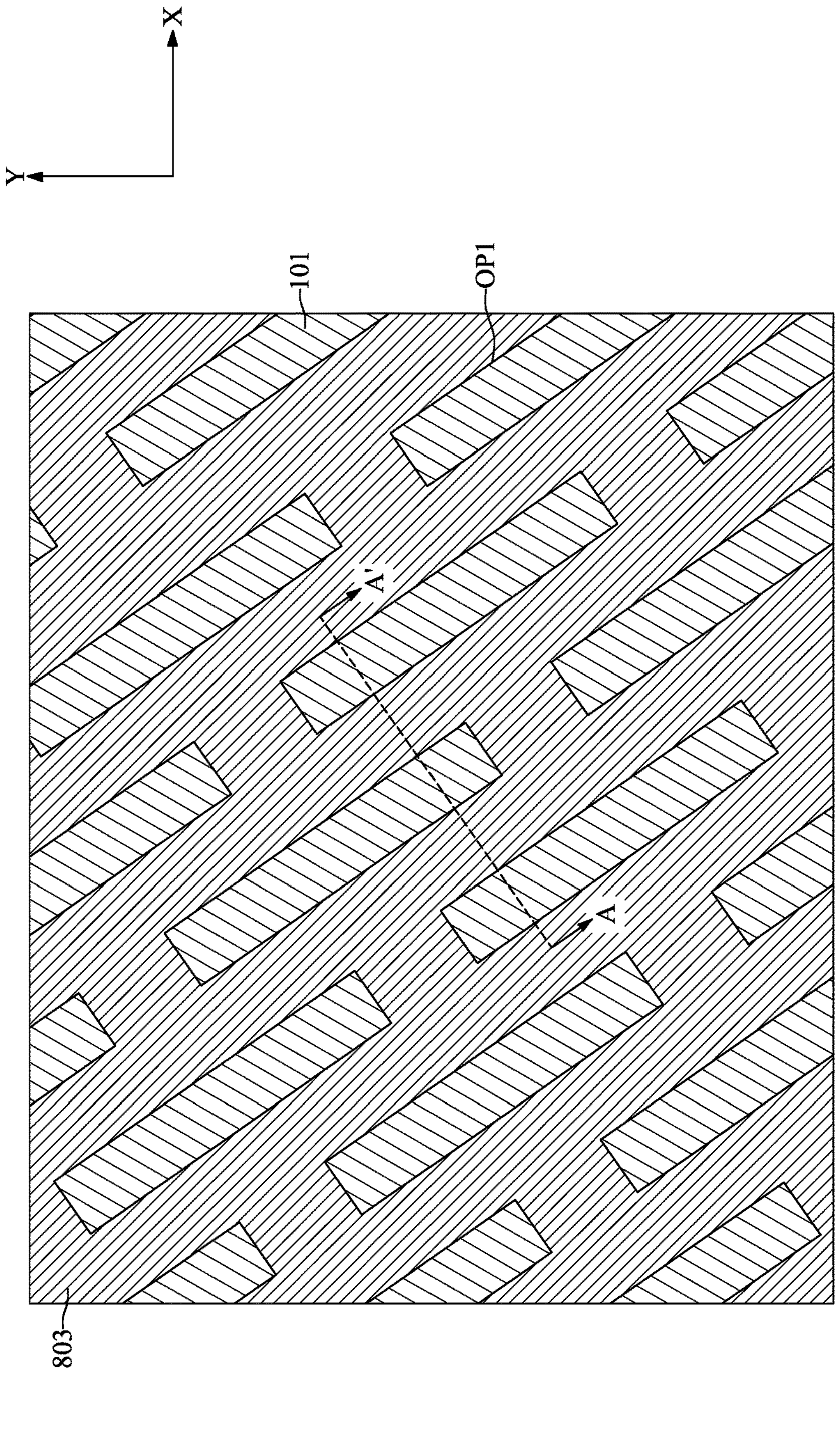
FIG. 8 illustrates, in a schematic top-view diagram, an intermediate semiconductor device in accordance with one embodiment of the present disclosure.
Figure 9:
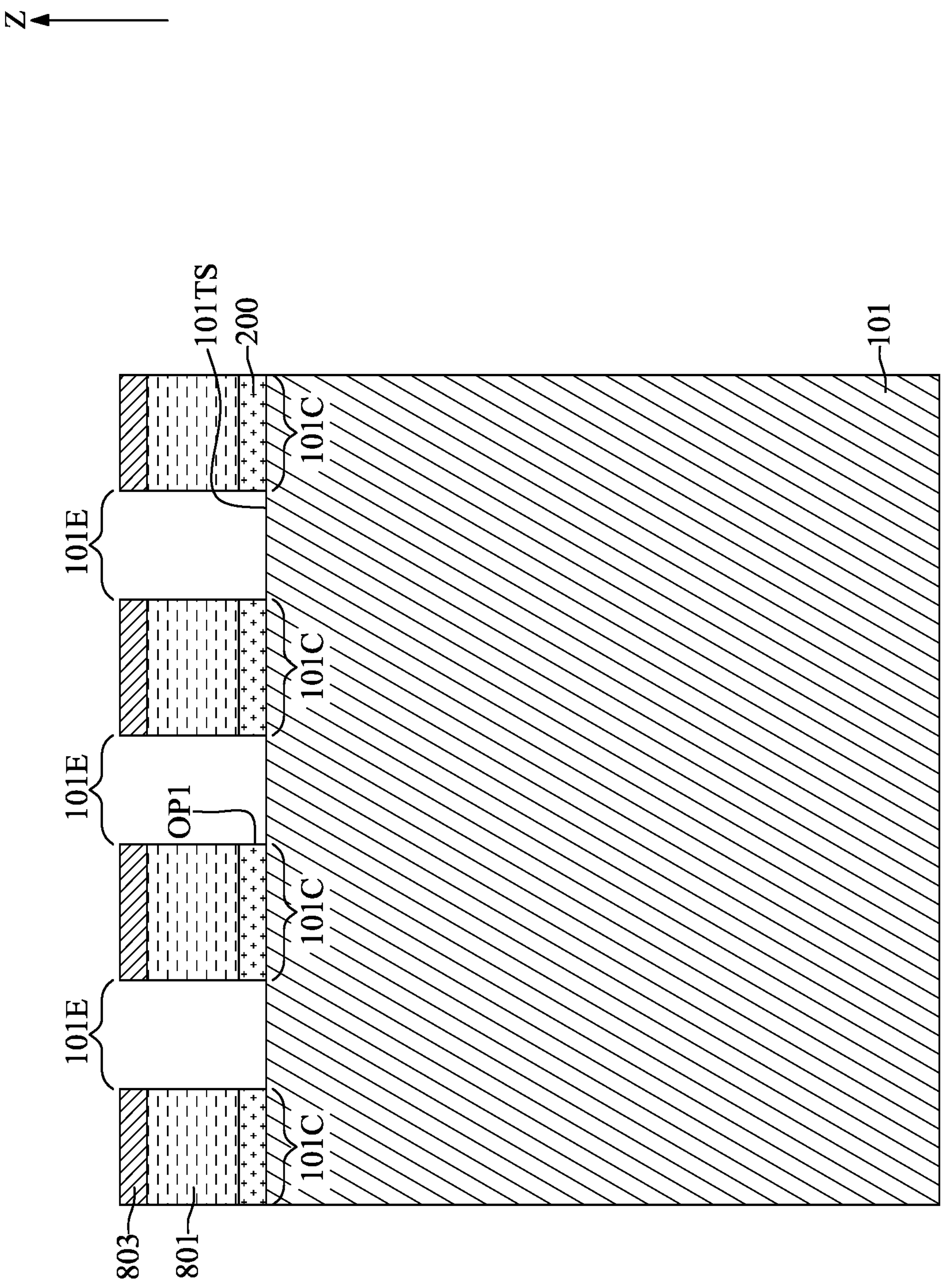
FIG. 9 is a schematic cross-sectional view diagram taken along a line A-A' in FIG. 8 illustrating part of the flow for fabricating the semiconductor device in accordance with one embodiment of the present disclosure.

FIG. 4 illustrates, in a schematic top-view diagram, an intermediate semiconductor device in accordance with one embodiment of the present disclosure. FIG. 5 is a schematic cross-sectional view diagram taken along a line A-A' in FIG. 4 illustrating part of the flow for fabricating the semiconductor device 1A in accordance with one embodiment of the present disclosure. FIG. 6 illustrates, in a schematic top-view diagram, an intermediate semiconductor device in accordance with one embodiment of the present disclosure. FIG. 7 is a schematic cross-sectional view diagram taken along a line A-A' in FIG. 6 illustrating part of the flow for fabricating the semiconductor device 1A in accordance with one embodiment of the present disclosure. FIG. 8 illustrates, in a schematic top-view diagram, an intermediate semiconductor device in accordance with one embodiment of the present disclosure. FIG. 9 is a schematic cross-sectional view diagram taken along a line A-A' in FIG. 8 illustrating part of the flow for fabricating the semiconductor device 1A in accordance with one embodiment of the present disclosure.

With reference to FIG. 1 and FIGS. 4 to 9, at step S13, the catalytic conductive layer 200 may be patterned to expose a plurality of exposed portions 101E of the substrate 101, while leaving a covered portion 101C of the substrate 101 still covered by the catalytic conductive layer 200.

With reference to FIGS. 4 and 5, an under layer 801 may be formed on the catalytic conductive layer 200, a hard-mask layer 803 may be formed on the under layer 801, and a mask layer 805 may be formed on the hard-mask layer 803.

In some embodiments, the under layer 801 may include a self-planarizing material such as a spin-on glass or a spin-on low-k dielectric material. The use of a self-planarizing dielectric material may avoid the need to perform a subsequent planarizing step. In some embodiments, the under layer 801 may be configured as an anti-reflective layer. In some embodiments, the under layer 801 may consist of thin film structures with alternating layers of contrasting refractive index. The thickness of the under layer 801 may be chosen to produce destructive interference in the beams reflected from the interfaces, and constructive interference in the corresponding transmitted beams. By way of example, and by no means limiting, the under layer 801 may be formed of, for example, oxides, sulfides, fluorides, nitrides, selenides, or a combination thereof. In some embodiments, the under layer 801 may improve the resolution of the lithography process. In some embodiments, the under layer 801 may be formed by a deposition process including, for example, chemical vapor deposition, plasma enhanced chemical vapor deposition, evaporation, spin-on coating, or other applicable deposition processes.

In some embodiments, the hard-mask layer 803 may be formed of, for example, boron nitride, silicon boron nitride, phosphorus boron nitride, or boron carbon silicon nitride. In some embodiments, the hard-mask layer 803 may be formed by, for example, atomic layer deposition, chemical vapor deposition, or other applicable deposition processes. In some embodiments, the hard-mask layer 803 may be formed by a film formation process and a treatment process. Detailedly, in the film formation process, first precursors, which may be boron-based precursors, may be introduced over the catalytic conductive layer 200 to form a boron-based layer. Subsequently, in the treatment process, second precursors, which may be nitrogen-based precursors, may be introduced to react with the boron-based layer and turn the boron-based layer into the hard-mask layer 803.

In some embodiments, the first precursors may be, for example, diborane, borazine, or an alkyl-substituted derivative of borazine. In some embodiments, the first precursors may be introduced at a flow rate between about 5 sccm (standard cubic centimeters per minute) and about 50 slm (standard liter per minute) or between about 10 sccm and about 1 slm. In some embodiments, the first precursors may be introduced by dilution gas such as nitrogen, hydrogen, argon, or a combination thereof. The dilution gas may be introduced at a flow rate between about 5 sccm and about 50 slm or between about 1 slm and about 10 slm.

In some embodiments, the film formation process may be performed without an assistant of plasma. In such a situation, the substrate temperature of the film formation process may be between about 100° C. and about 1000° C. For example, the substrate temperature of the film formation process may be between about 300° C. and about 500° C. The process pressure of the film formation process may be between about 10 mTorr and about 760 Torr. For example, the process pressure of the film formation process may be between about 2 Torr and about 10 Torr.

In some embodiments, the film formation process may be performed in the presence of plasma. In such a situation, the substrate temperature of the film formation process may be between about 100° C. and about 1000° C. For example, the substrate temperature of the film formation process may be between about 300° C. and about 500° C. The process pressure of the film formation process may be between about 10 mTorr and about 760 Torr. For example, the process pressure of the film formation process may be between about 2 Torr and about 10 Torr. The plasma may be generated by a RF power between 2 W and 5000 W. For example, the RF power may be between 30 W and 1000 W.

In some embodiments, the second precursors may be, for example, ammonia or hydrazine. In some embodiments, the second precursors may be introduced at a flow rate between about 5 sccm and about 50 slm or between about 10 sccm and about 1 slm.

In some embodiments, oxygen-based precursors may be introduced with the second precursors in the treatment process. The oxygen-based precursors may be, for example, oxygen, nitric oxide, nitrous oxide, carbon dioxide, or water.

In some embodiments, silicon-based precursors may be introduced with the second precursors in the treatment process. The silicon-based precursors may be, for example, silane, trisilylamine, trimethylsilane, or silazanes (e.g., hexamethylcyclotrisilazane).

In some embodiments, phosphorus-based precursors may be introduced with the second precursors in the treatment process. The phosphorus-based precursors may be, for example, phosphine.

In some embodiments, oxygen-based precursors, silicon-based precursors, or phosphorus-based precursors may be introduced with the second precursors in the treatment process.

In some embodiments, the treatment process may be performed with an assistant of a plasma process, a UV cure process, a thermal anneal process, or a combination thereof.

When the treatment is performed with the assistance of the plasma process. The plasma of the plasma process may be generated by the RF power. In some embodiments, the RF power may be between about 2 W and about 5000 W at a single low frequency of between about 100 kHz up to about 1 MHz. In some embodiments, the RF power may be between about 30 W and about 1000 W at a single high frequency greater than about 13.6 MHz. In such a situation, a substrate temperature of the treatment process may be between about 20° C. and about 1000° C. The process pressure of the treatment process may be between about 10 mTorr and about 760 Torr.

When the treatment is performed with the assistance of the UV cure process, in such a situation, the substrate temperature of the treatment process may be between about 20° C. and about 1000° C. The process pressure of the treatment process may be between about 10 mTorr and about 760 Torr. The UV cure may be provided by any UV source, such as mercury microwave arc lamps, pulsed xenon flash lamps, or high-efficiency UV light emitting diode arrays. The UV source may have a wavelength of between about 170 nm and about 400 nm. The UV source may provide a photon energy between about 0.5 eV and about 10 eV, or between about 1 eV and about 6 eV. The assistance of the UV cure process may remove hydrogen from the hard-mask layer 803. As hydrogen may diffuse through into other areas of the semiconductor device 1A and may degrade the reliability of the semiconductor device 1A, the removal of hydrogen by the assistance of UV cure process may improve the reliability of the semiconductor device 1A. In addition, the UV cure process may increase the density of the hard-mask layer 803.

When the treatment is performed with the assistant of the thermal anneal process. In such a situation, a substrate temperature of the treatment process may be between about 20° C. and about 1000° C. The process pressure of the treatment process may be between about 10 mTorr and about 760 Torr.

In some embodiments, the hard-mask layer 803 may be a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon. In some embodiments, the hard-mask layer 803 may be composed of carbon and hydrogen. In some embodiments, the hard-mask layer 803 may be composed of carbon, hydrogen, and oxygen. In some embodiments, the hard-mask layer 803 may be composed of carbon, hydrogen, and fluorine.

In some embodiments, the carbon film may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene, propyne, propane, butane, butylene, butadiene, or acetylene, or a combination thereof.

In some embodiments, the mask layer 805 may be a photoresist layer and may include a plurality of plurality of openings OP1. The plurality of openings OP1 may define the pattern of the mask layer 805.

With reference to FIGS. 6 and 7, a hard-mask etching process employing the mask layer 805 as a mask may be performed to etch away parts of the hard-mask layer 803. Following the hard-mask etching process, the plurality of openings OP1 may be extended to reach the hard-mask layer 803, transferring the pattern from the mask layer 805 to the hard-mask layer 803. This results in portions of the top surface of the underlying layer 801 being exposed through the plurality of openings OP1. After transferring the pattern of the mask layer 805 to the hard-mask layer 803, the mask layer 805 can then be removed using an ashing process or other suitable semiconductor processes.

With reference to FIGS. 8 and 9, a pattern etching process using the hard-mask layer 803 as the mask may be performed to remove portions of the under layer 801 and the catalytic conductive layer 200. In some embodiments, the pattern etching process may be a multi-stage etching process, with different stages employing varying etching chemistries to selectively remove targeted layer(s).

After the pattern etching process, the plurality of openings OP1 may be extended to the catalytic conductive layer 200. Part of the top surface 101TS of the substrate 101 may be exposed through the plurality of openings OP1 and may be referred to as the plurality of exposed portions 101E of the substrate 101. Meanwhile, the rest part of the top surface 101TS of the substrate 101 that is still covered (or masked) by the catalytic conductive layer 200 may be referred to as the covered portion 101C of the substrate 101.

In some embodiments, the under layer 801 and the hard-mask layer 803 may be optional. That is, the mask layer 805 may be directly formed on the catalytic conductive layer 200. The pattern of the mask layer 805 (i.e., the plurality of openings OP1) may be directly transferred to the catalytic conductive layer 200.

Figure 10:
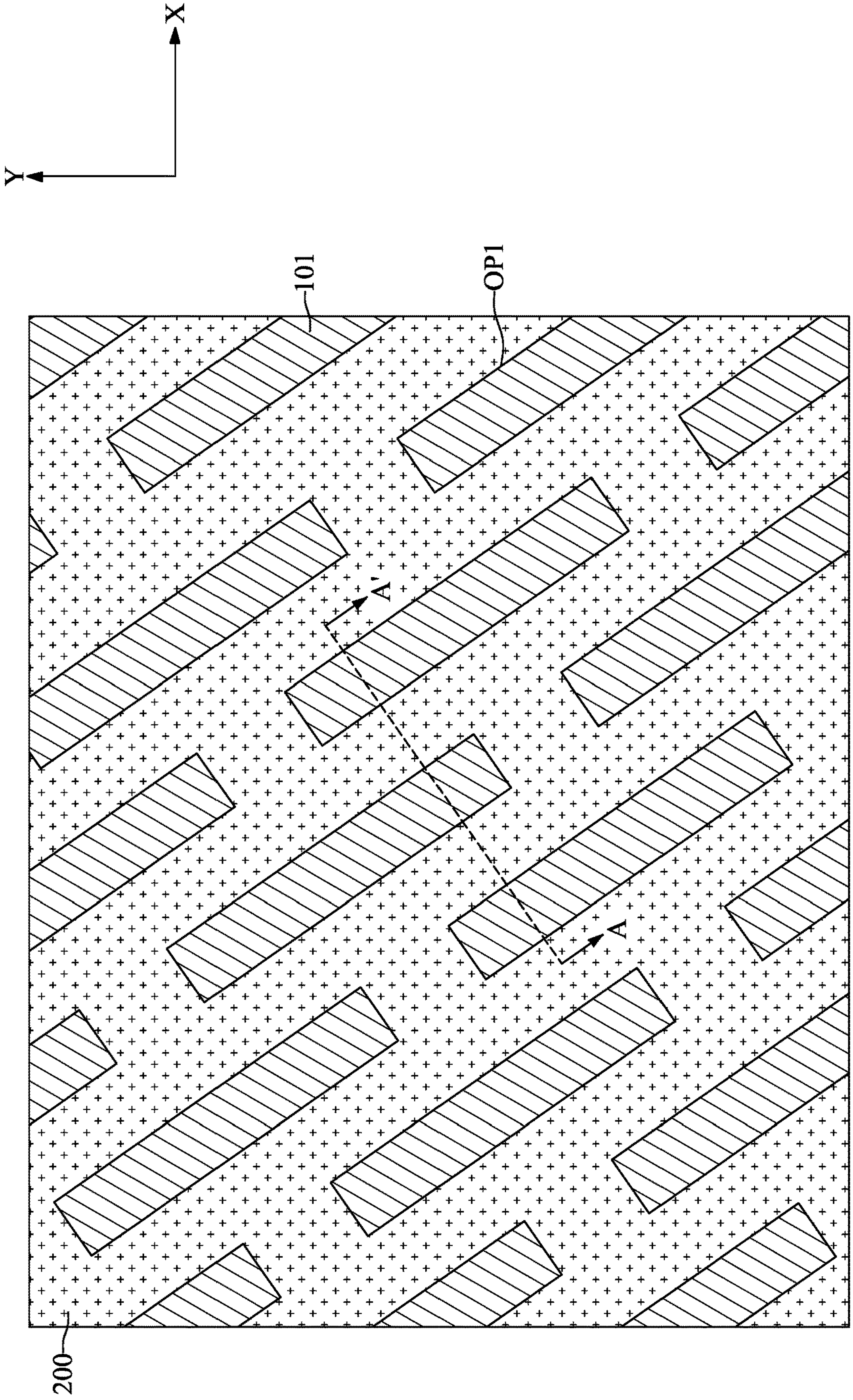
FIG. 10 illustrates, in a schematic top-view diagram, an intermediate semiconductor device in accordance with one embodiment of the present disclosure.
Figure 15:
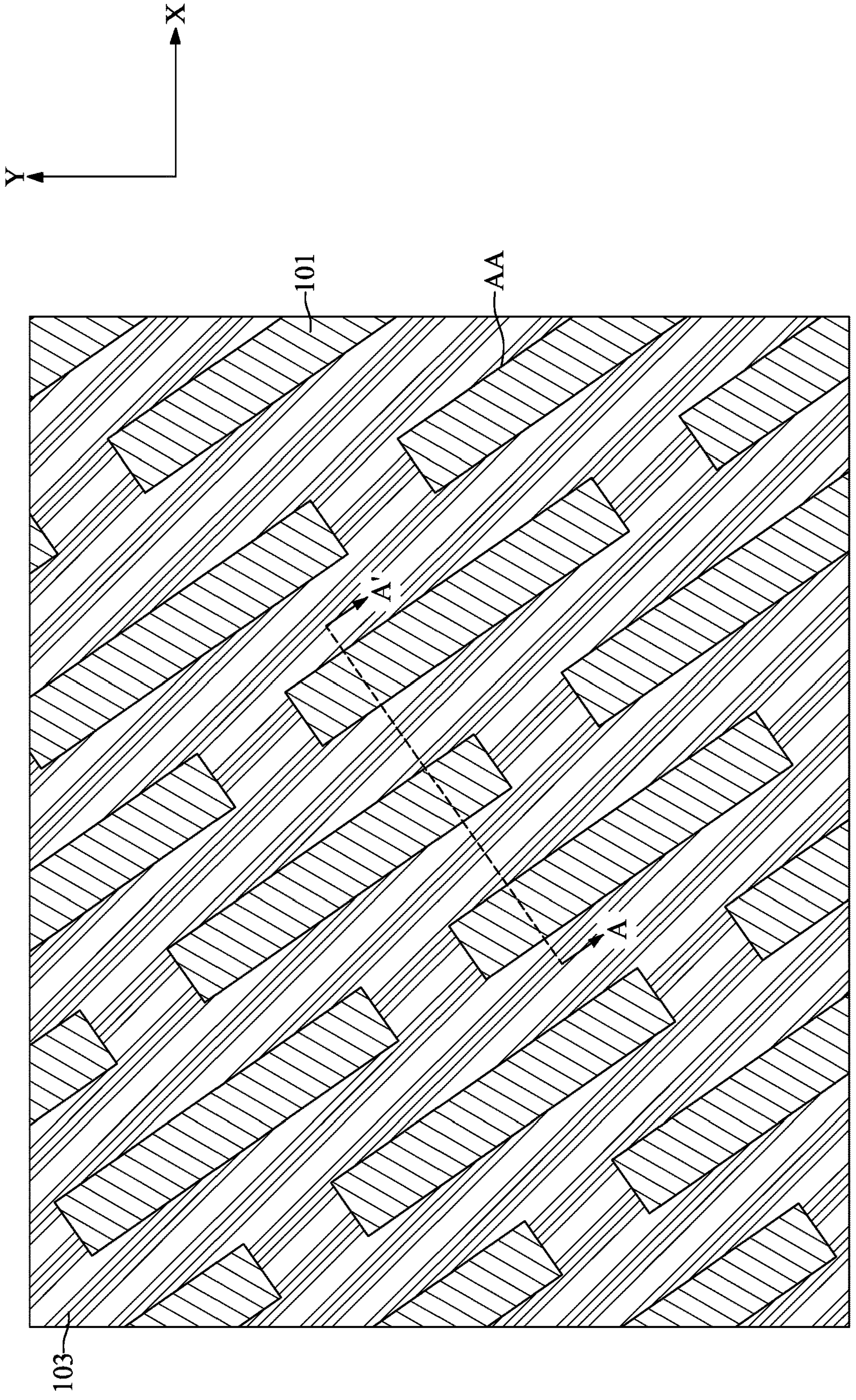
FIG. 15 illustrates, in a schematic top-view diagram, an intermediate semiconductor device in accordance with one embodiment of the present disclosure.
Figure 16:
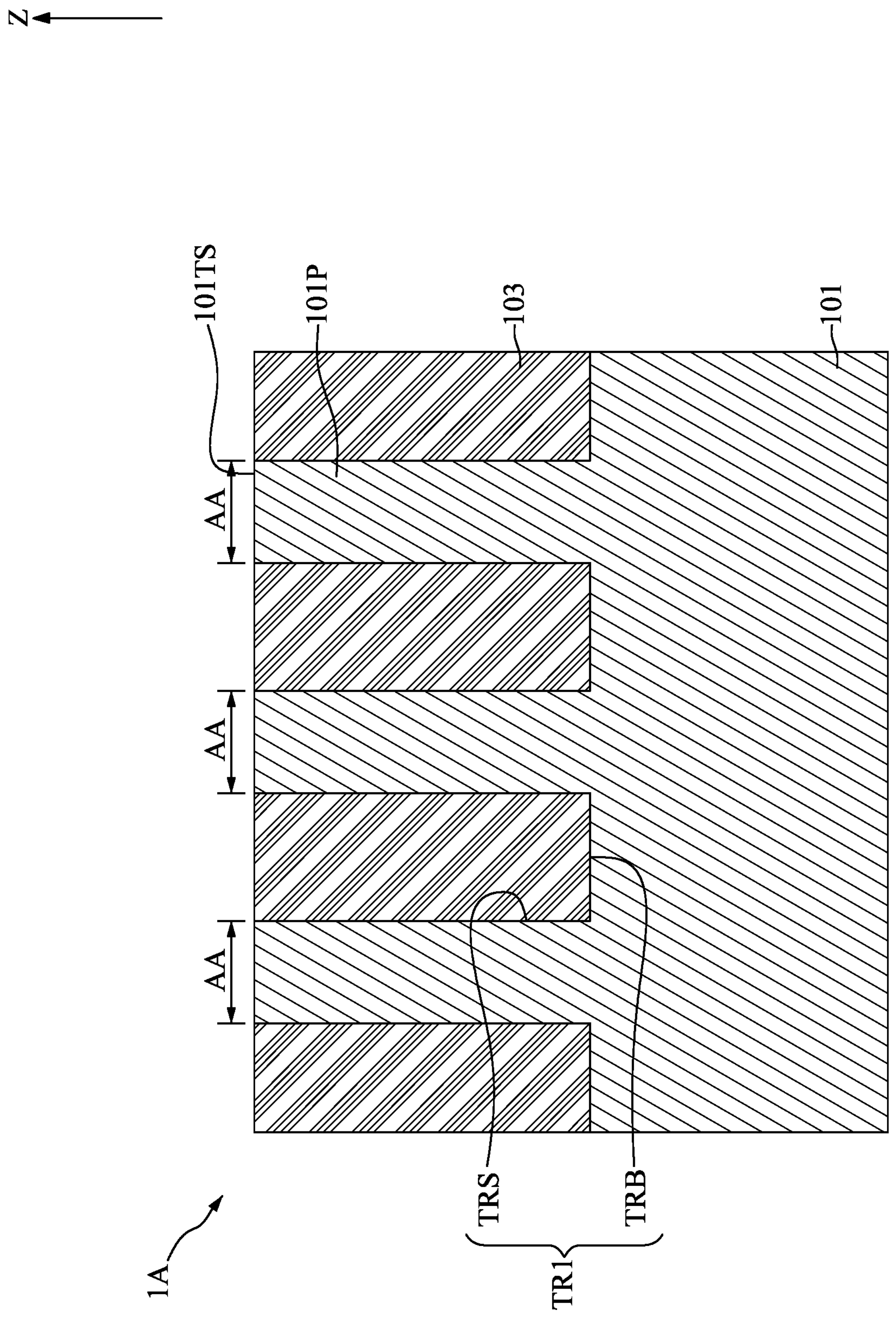
FIG. 16 is a schematic cross-sectional view diagram taken along a line A-A' in FIG. 15 illustrating part of the flow for fabricating the semiconductor device in accordance with one embodiment of the present disclosure.

FIG. 10 illustrates, in a schematic top-view diagram, an intermediate semiconductor device in accordance with one embodiment of the present disclosure. FIGS. 11 to 14 are schematic cross-sectional view diagrams taken along a line A-A' in FIG. 10 illustrating part of the flow for fabricating the semiconductor device 1A in accordance with one embodiment of the present disclosure. FIG. 15 illustrates, in a schematic top-view diagram, an intermediate semiconductor device in accordance with one embodiment of the present disclosure. FIG. 16 is a schematic cross-sectional view diagram taken along a line A-A' in FIG. 15 illustrating part of the flow for fabricating the semiconductor device 1A in accordance with one embodiment of the present disclosure.

With reference to FIG. 1 and FIGS. 10 to 16, at step S15, the covered portion 101C may be recessed to form a first trench TR1, the catalytic conductive layer 200 may be removed, and an isolation layer 103 may be formed in the first trench TR1.

Figure 11:
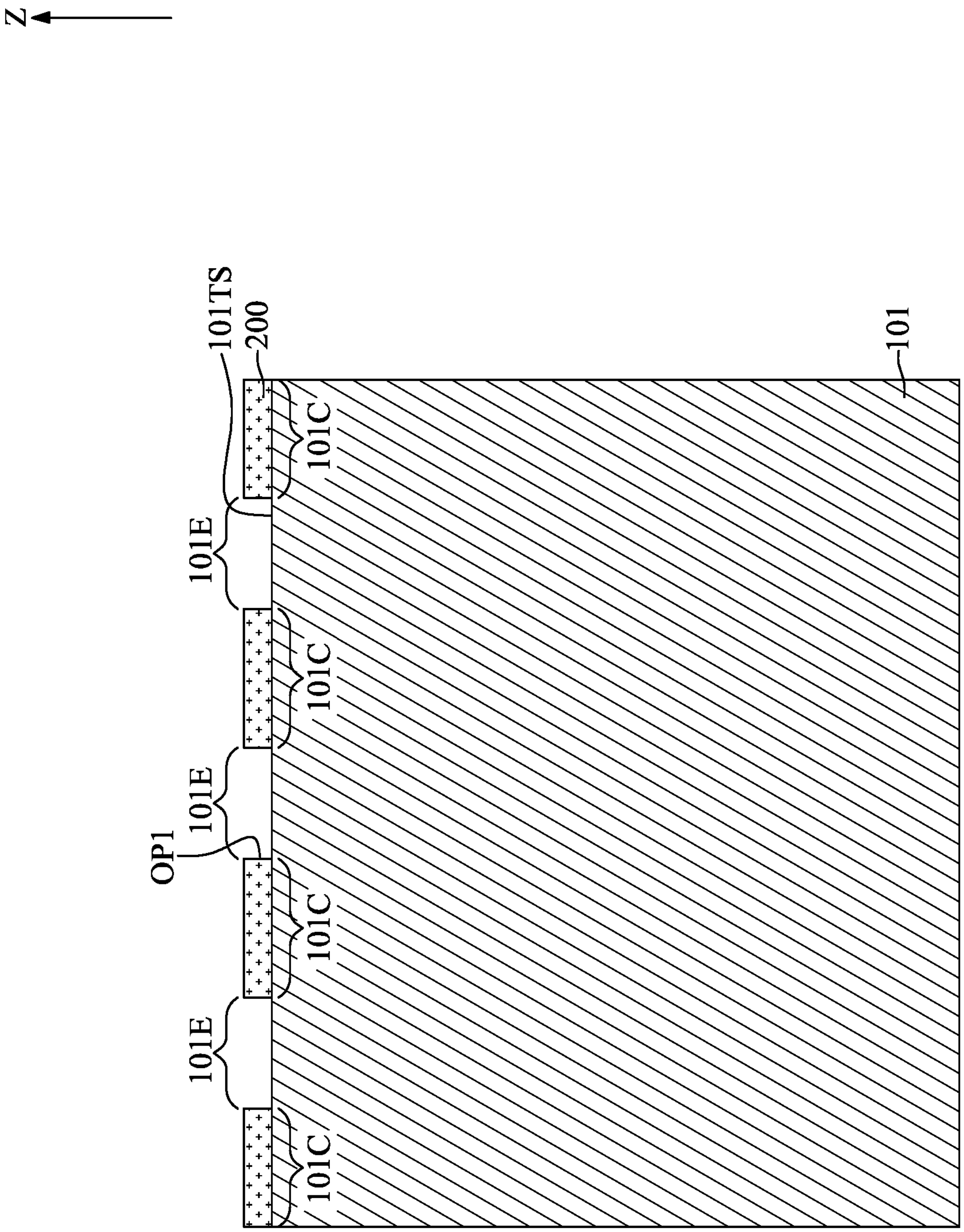
FIGS. 11 to 14 are schematic cross-sectional view diagrams taken along a line A-A' in FIG. 10 illustrating part of the flow for fabricating the semiconductor device in accordance with one embodiment of the present disclosure.

With reference to FIGS. 10 and 11, the hard-mask layer 803 and the under layer 801 may be removed. The plurality of exposed portions 101E may be exposed through the plurality of openings OP1 of the catalytic conductive layer 200. The covered portion 101C may be covered by the catalytic conductive layer 200.

Figure 12:
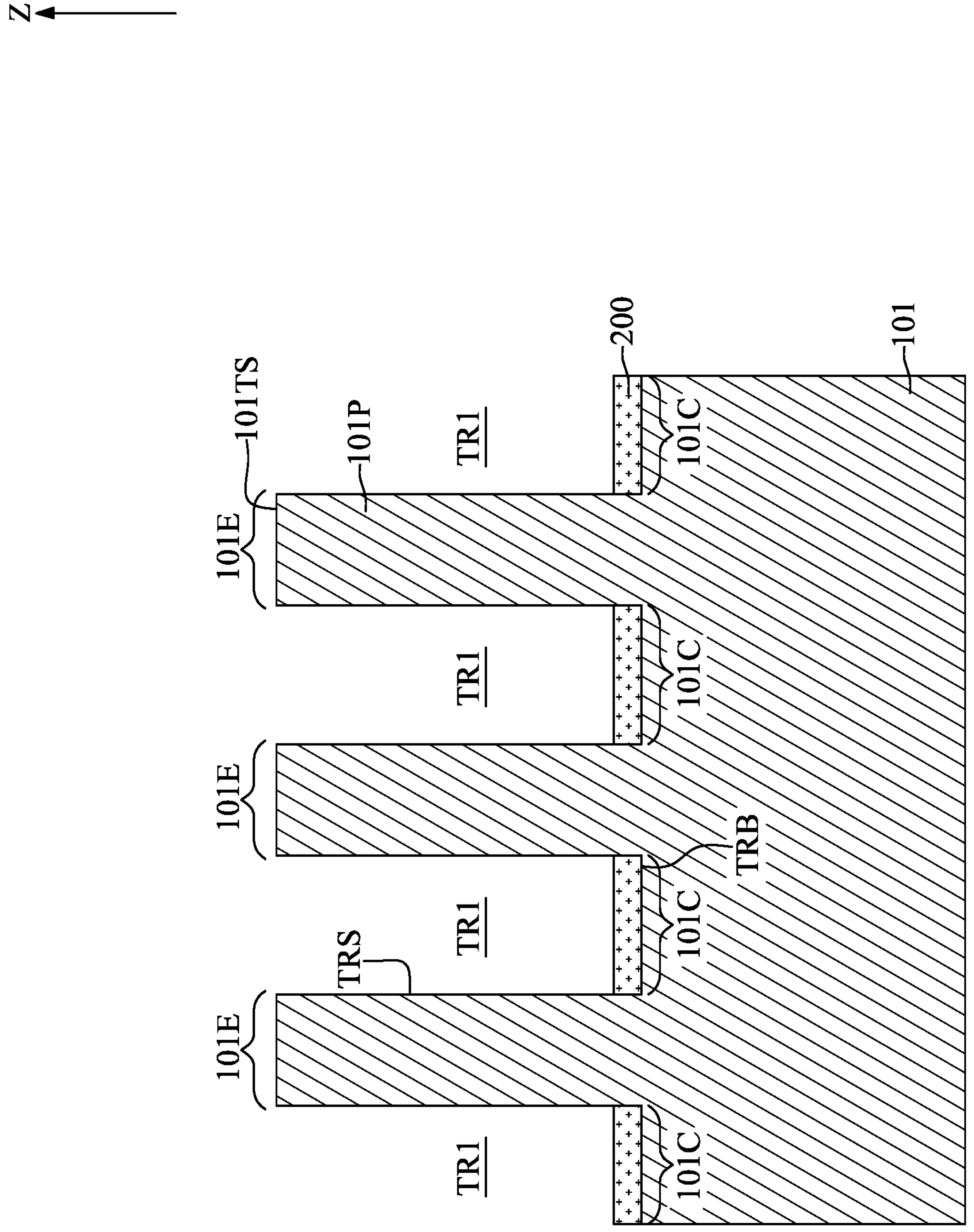

With reference to FIG. 12, a trench-etching process may be performed to recess the covered portion 101C, resulting in a first trench TR1. In contrast, the exposed portion 101E may be intact after the trench-etching process to form a plurality of protruding features which are referred to as the plurality of protruding portions 101P.

In some embodiments, the trench-etching process may be a metal-assisted chemical etching process. In some embodiments, the metal-assisted chemical etching process may employ an etchant solution. In some embodiments, the metal-assisted chemical etching process may include applying a patterned metal film (i.e., the catalytic conductive layer 200) on the substrate 101, which serves as a catalyst for etching when exposed to a suitable etchant, typically a combination of an oxidant such as hydrogen peroxide or potassium permanganate, and an acid like hydrofluoric acid. During the etching process, the metal catalyst reduces the oxidant, generating free holes at the metal-semiconductor interface, and this reaction selectively oxidizes the semiconductor beneath the metal (i.e., the covered portion 101C). The acid then dissolves the oxidized semiconductor, allowing continuous etching in a direction approximately normal to the semiconductor-metal interface.

In some embodiments, the oxidant for the etchant of the trench-etching process may include, for example, hydrogen peroxide, potassium permanganate, nitric acid, silver nitrate, or sodium persulfate. In some embodiments, the acid for the etchant of the trench-etching process may include, for example, hydrofluoric acid, or nitric acid.

In some embodiments, the process may include using a dilute hydrofluoric acid bath with oxidants like hydrogen peroxide or oxygen bubbled through it. In some embodiments, the intermediate semiconductor device illustrated in FIG. 11 may be immersed in a solution of acid (e.g., hydrofluoric acid) and an oxidant (e.g., hydrogen peroxide) for a duration between about 10 seconds and about 20 minutes, between about 30 seconds and 15 minutes, between about 30 seconds and about 5 minutes, or between about 1 minute and 3 minutes. In some embodiments, the concentration ratio of the hydrofluoric acid to the oxidant may be between about 0.67:1 and about 3:1, between about 1:1 and about 2.5:1, or between about 1.5:1 and about 2:1. The concentration of the etchant solution plays a crucial role in determining the etching direction and morphology of the resulting intermediate semiconductor device.

Alternatively, when the catalytic conductive layer 200 is formed of titanium nitride, the trench-etching process may employ a vapor etchant. In some embodiments, the vapor etchant may include evaporated oxidants and acids, such as hydrogen peroxide and hydrofluoric acid. In this situation, the catalytic conductive layer 200 formed of titanium nitride, although nonmetallic, may act as a catalyst due to its high work function and electrochemical potential, and its resistance to hydrofluoric acid. The vapor oxidant may oxidize regions of the substrate beneath the catalytic conductive layer 200 (i.e., the covered portion 101C), and the vapor acid then removes these oxidized regions, allowing the catalytic conductive layer 200 to sink into the substrate 101 and form the first trench TR1.

In some embodiments, the substrate 101 may be heated to a temperature (also referred to as the substrate temperature) between about 25° C. and about 100° C. or between about 30° C. and about 95° C. The heating of substrate 101 may help in promoting etching and the formation of high aspect ratio features (e.g., the first trench TR1). The vapor etchant may be kept at a similar temperature to the substrate 101 to minimize condensation, which could impede the etchant and byproduct vapors' diffusion through the catalytic conductive layer 200. In other words, the process temperature for the vapor etchant may be between about 25° C. and about 100° C. or between about 30° C. and about 95° C. In some embodiments, the trench-etching process may be conducted in a controlled environment, like an inert atmosphere or a vacuum, to maintain stability.

In some embodiments, the vapor etchant may include hydrogen peroxide, potassium permanganate, potassium persulfate, and/or sodium persulfate. In some embodiments, the vapor acid may include hydrofluoric acid and/or nitric acid.

In some embodiments, the formation of the vapor etchant may involve separately heating sources containing the oxidant and the acid to generate their respective vapors (i.e., vapor oxidant and vapor acid). These vapors may be then transported to the intermediate semiconductor device illustrated in FIG. 11 in an enclosed chamber via a carrier gas, possibly nitrogen, argon, or helium. The flow of each vapor can be controlled precisely, allowing for a specific oxidant-to-acid ratio, essential for the desired etching outcome.

In some embodiments, the process duration of the trench-etching process employing vapor etchant may be between about 10 seconds and about 60 minutes, or between about 1 minute and about 30 minutes, or between about 5 minutes and about 20 minutes.

In some embodiments, the partial vapor pressures of the vapor oxidant and the vapor acid may be selected based on the desired molar ratio, influencing the etching direction and rate. For example, the vapor oxidant might have a partial vapor pressure between about 1 and about 10 Torr, while the vapor acid may range between about 20 and about 60 Torr. In some embodiments, the molar ratio of vapor oxidant to vapor acid may be between about 0.02 and about 10.

Figure 13:
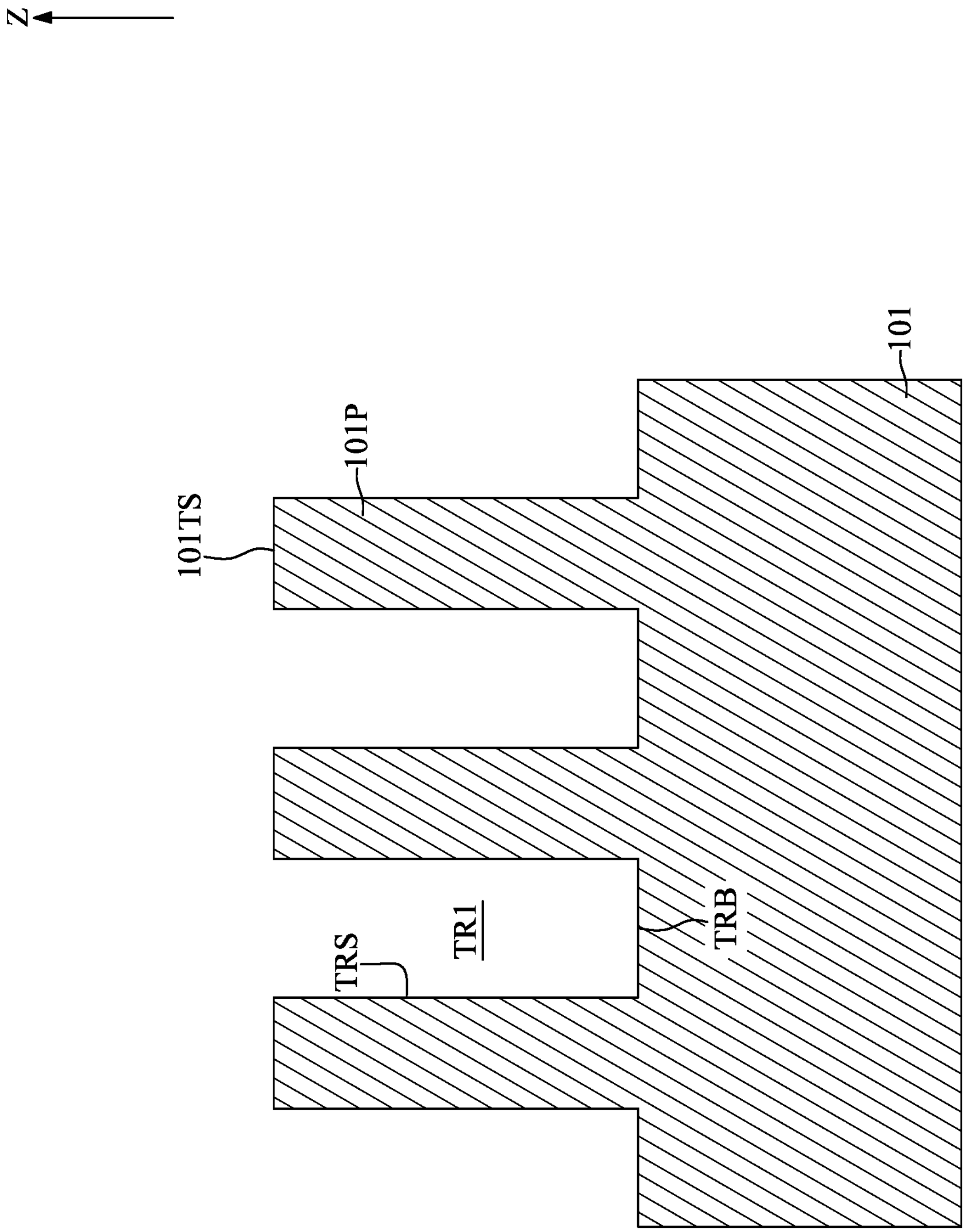

With reference to FIG. 13, the catalytic conductive layer 200 may be removed. In some embodiments, the removal of the catalytic conductive layer 200 may be achieved by a wet etching or dry etching. In some embodiments, the etchant for the removal of the catalytic conductive layer 200 may include, for example, hydrochloric acid, nitric acid, or mixture of ammonium hydroxide and hydrogen peroxide.

In some embodiments, in a cross-sectional perspective, the first trench TR1 may include a plurality of bottom surfaces TRB and a plurality of sidewalls TRS. For brevity, clarity, and convenience of description, only one bottom surface TRB and one sidewall TRS are described. In some embodiments, the bottom surface TRB may be substantially flat. In some embodiments, the bottom surface TRB may be parallel to the top surface 101TS of the substrate 101. In some embodiments, the sidewall TRS may be substantially vertical. In some embodiments, the sidewall TRS may be perpendicular to the top surface 101TS of the substrate 101 or the bottom surface TRB. In some embodiments, the aspect ratio of the first trench TR1 may be between about 4:1 and about 12:1 or between about 6:1 and about 8:1.

It should be noted that, in the description of the present disclosure, a surface is "substantially vertical" if there exists a vertical plane from which the surface does not deviate by more than three times the root mean square roughness of the surface.

Figure 14:
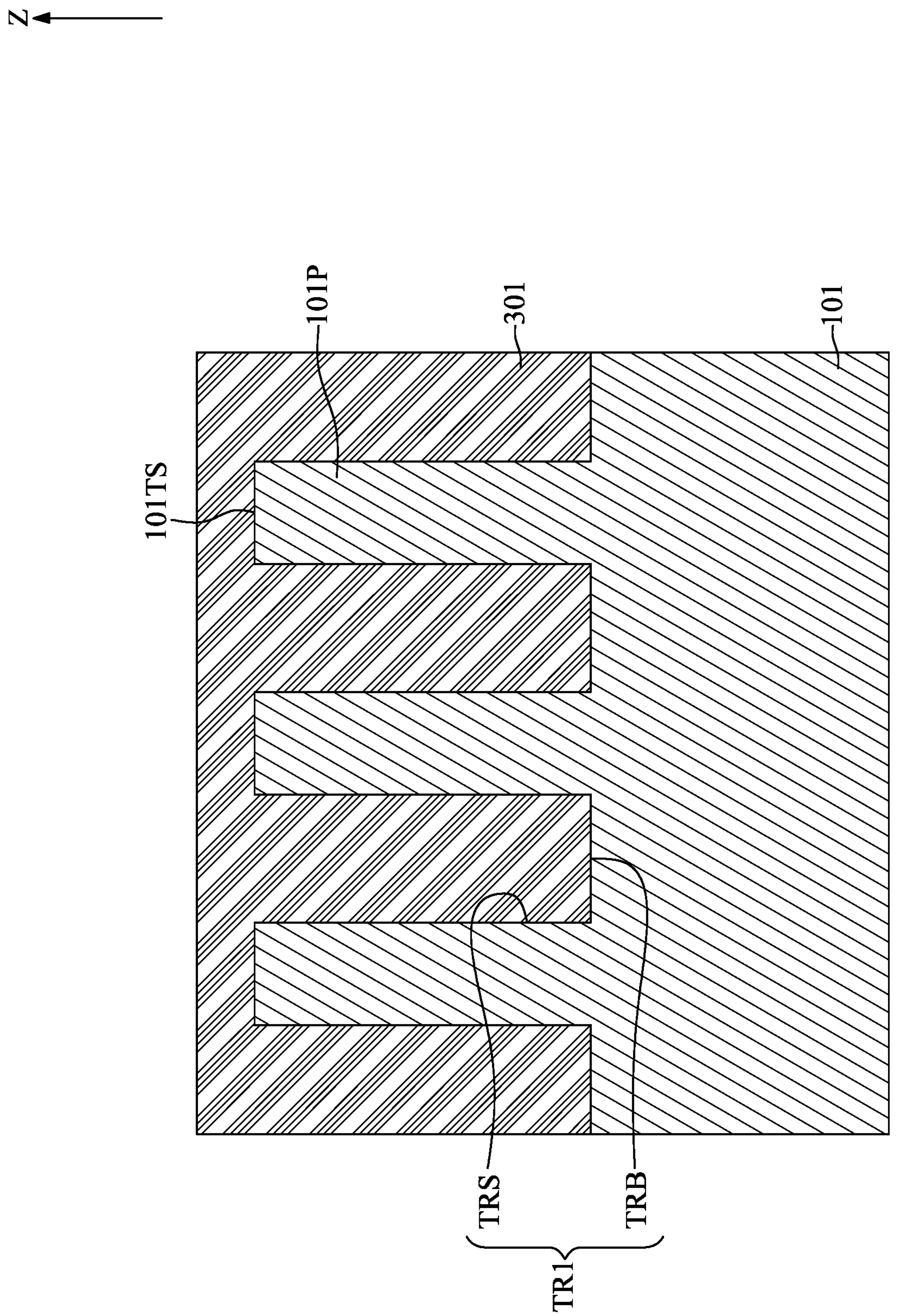

With reference to FIG. 14, a layer of isolation material 301 may be formed to completely fill the first trench TR1. In some embodiments, the isolation material 301 may include, for example, silicon oxide or other applicable insulating materials. In some embodiments, the layer of isolation material 301 may be formed by, for example, chemical vapor deposition or other applicable deposition processes.

With reference to FIGS. 15 and 16, a planarization process, such as chemical mechanical polishing, may be performed until the top surface 101TS of the substrate 101 is exposed to remove excess material and provide a substantially flat surface for subsequent processing steps. After the planarization process, the remaining isolation material 301 within the first trench TR1 may be referred to as the isolation layer 103. The protruding portions 101P of the substrate 101 which are surrounded by the isolation layer 103 may be configured as a plurality of active areas AA.

Conventionally, forming a trench may involve an anisotropic dry etching process that generates substantial by-products, necessitating a strong cleaning process for their removal. However, this strong cleaning process can cause the collapse of the profile (e.g., the protruding portions 101P) due to Laplace pressure and the high-aspect-ratio feature of the profile, leading to the need for additional recovery processes (e.g., oxidation, oxide etching, and silicon deposition). In contrast, the trench-etching process utilizing the catalytic conductive layer 200 does not produce massive by-products, eliminating the requirement for intense cleaning post-processing. This reduction in processing steps lowers both the cost and complexity of fabricating the semiconductor device 1A. Additionally, the by-products from the trench-etching process with the catalytic conductive layer 200 may be easily removed using an etchant solution which is also beneficial for reducing the complexity of fabricating the semiconductor device 1A.

Figure 17:
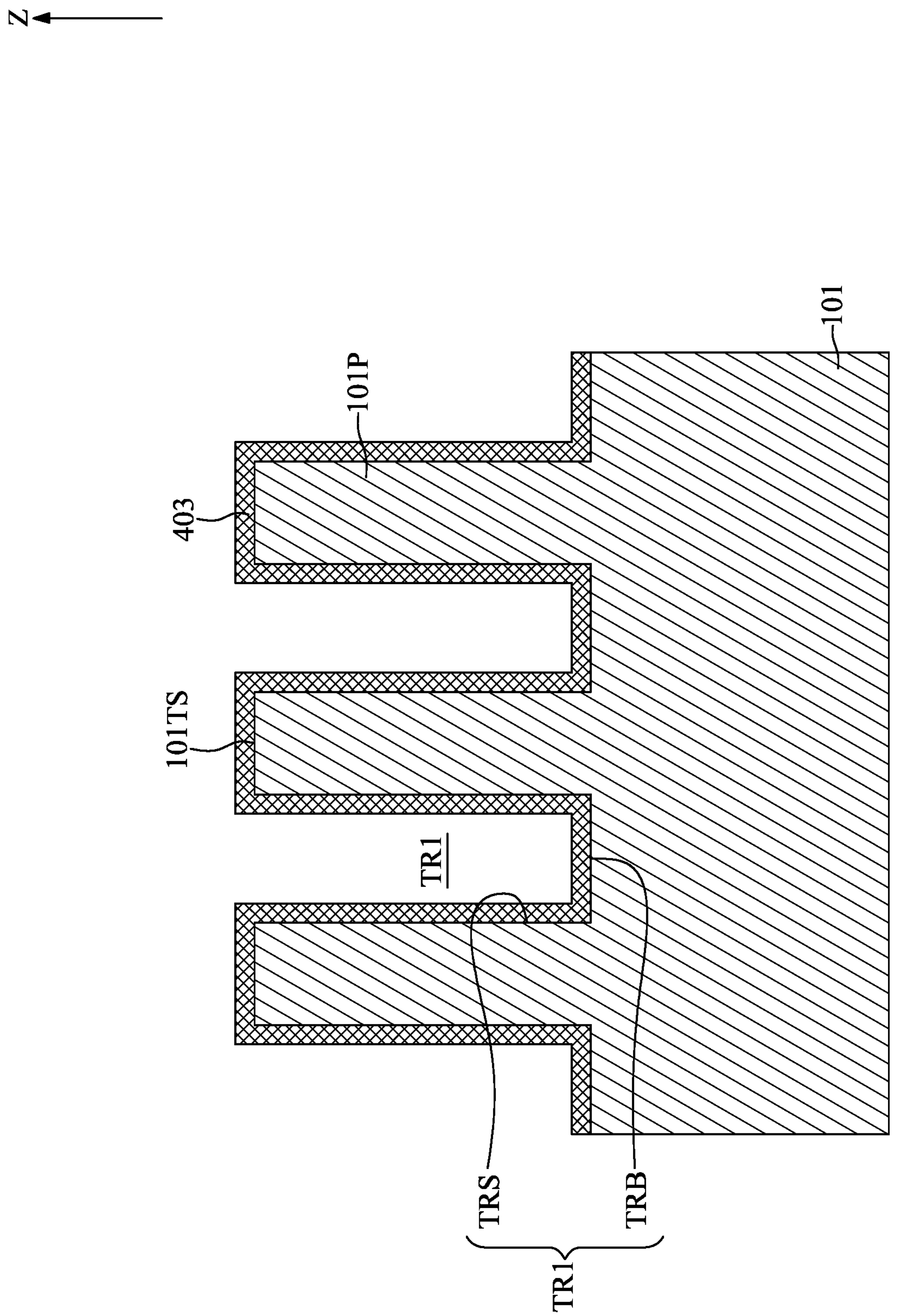
FIGS. 17 and 18 illustrate, in schematic cross-sectional view diagrams, part of a flow for fabricating a semiconductor device in accordance with another embodiment of the present disclosure.
Figure 18:
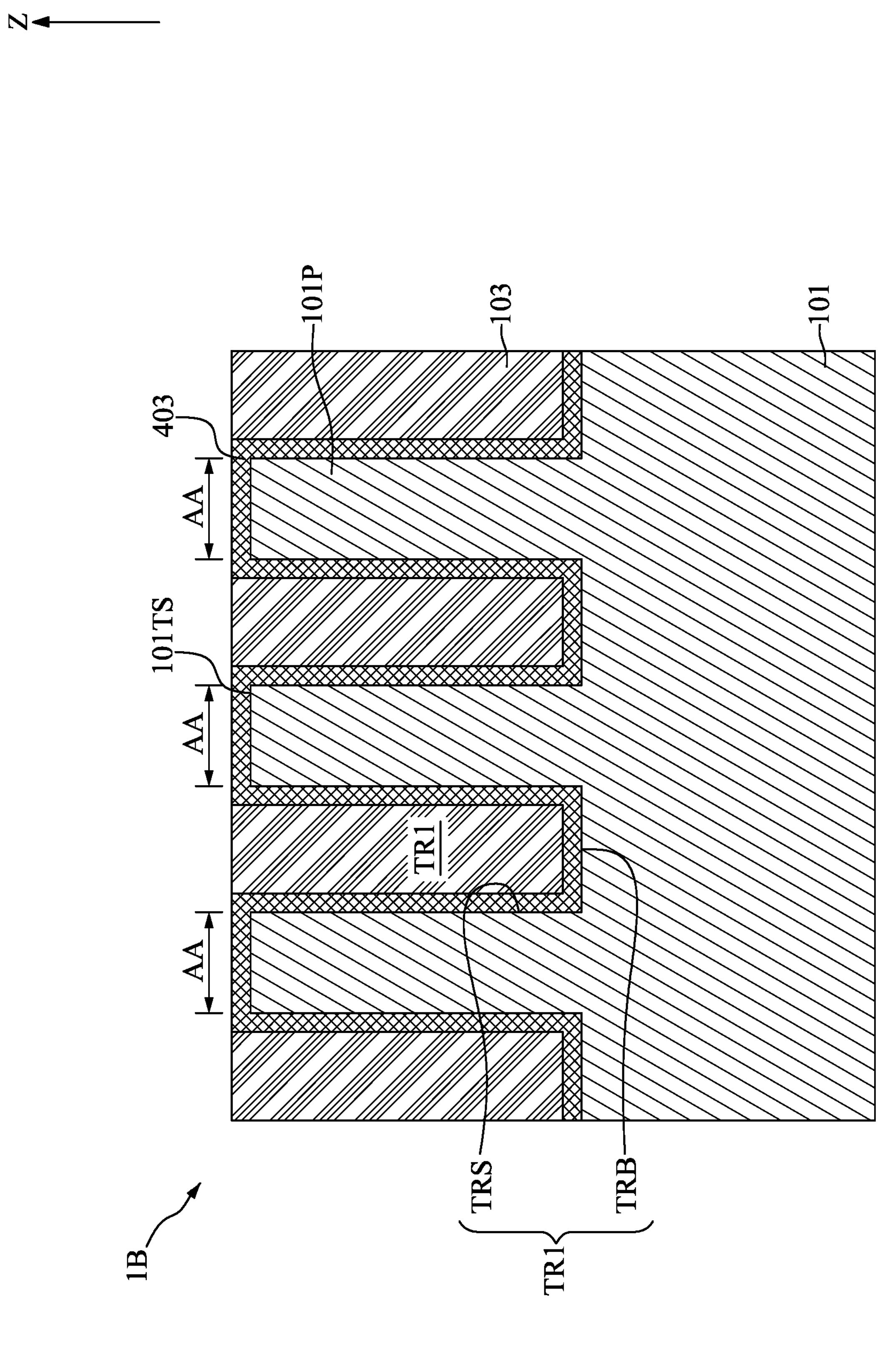
Figure 19:
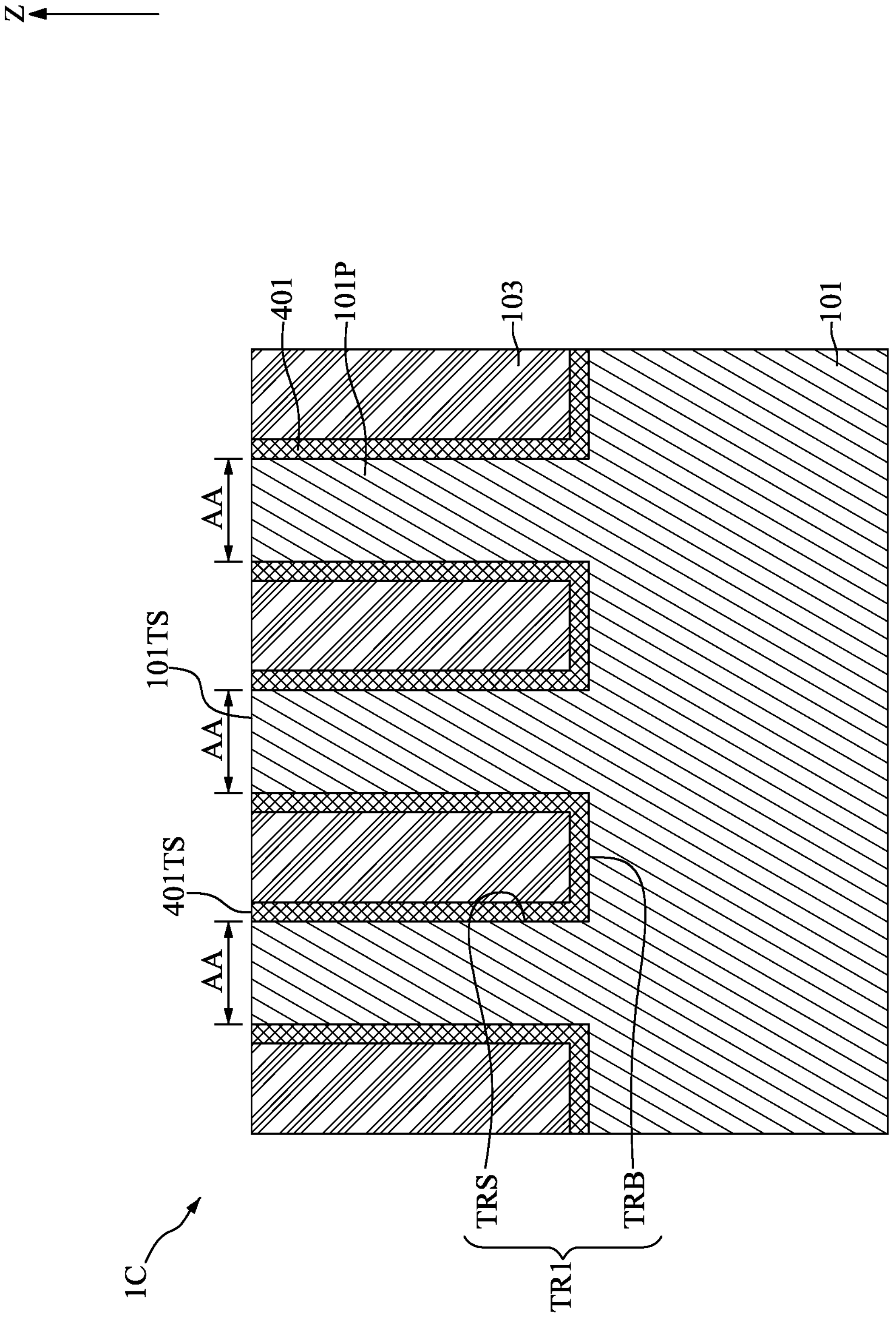
FIG. 19 illustrates, in a schematic cross-sectional view diagram, a semiconductor device in accordance with another embodiment of the present disclosure.

FIGS. 17 and 18 illustrate, in schematic cross-sectional view diagrams, part of a flow for fabricating a semiconductor device 1B in accordance with another embodiment of the present disclosure. FIG. 19 illustrates, in a schematic cross-sectional view diagram, a semiconductor device 1C in accordance with another embodiment of the present disclosure.

With reference to FIG. 17, an intermediate semiconductor device may be fabricated with a procedure similar to that illustrated in FIGS. 2 to 13, and descriptions thereof are not repeated herein. A layer of liner material 403 may be conformally formed in the first trench TR1 and on the top surface 101TS of the substrate 101. In some embodiments, the liner material 403 may be, for example, silicon oxide, silicon oxy nitride, or silicon nitride oxide.

In some embodiments, the layer of liner material 403 may be formed by performing a rapid thermal oxidation to the intermediate semiconductor device illustrated in FIG. 13 in an oxide/oxynitride atmosphere. In some embodiments, the process temperature of the rapid oxidation may be about 1000° C. In some embodiments, the corners of the first trench TR1 may be rounded after the rapid thermal oxidation (not shown).

Alternatively, in some embodiments, the layer of liner material 403 may be formed by a deposition process that concurrently flows tetraethoxysilane (TEOS) and ozone to the intermediate semiconductor device illustrated in FIG. 13. The substrate temperature during the deposition process may be greater than 400° C., greater than 500° C., or greater than 600° C. Additives such as water (steam), hexamethyldisilazane (HMDS), and 1,1,3,3-tetramethyldisiloxane (TMDSO) may be added to ensure a more flowable or smooth deposition. Exemplary flowrates of TEOS may be greater than 0.1 gm/min (grams per minute), greater than 0.5 gm/min, greater than 1 gm/min, or greater than 3 gm/min. Exemplary flowrates of ozone may be flowed at greater than 1000 sccm (standard cubic centimeters per minute), greater than 3000 sccm, greater than 10000 sccm, or greater than 30000 sccm. The layer of liner material 403 may improve adhesion and reduce incidences of delamination and cracking during and after subsequent processing. In addition, the layer of liner material 403 may exhibit a smoother outer surface which may positively affect the deposition dynamics in subsequent processing.

With reference to FIG. 18, the layer of isolation material 301 may be formed with a procedure similar to that illustrated in FIG. 14, and descriptions thereof are not repeated herein. A planarization process, such as chemical mechanical polishing, may be performed until the layer of liner material 403 is exposed to remove excess material and provide a substantially flat surface for subsequent processing steps. The procedure is similar to that illustrated in FIGS. 15 and 16, and descriptions thereof are not repeated herein.

With reference to FIG. 19, the semiconductor device 1C may have a structure similar to that illustrated in FIG. 18. The same or similar elements in FIG. 19 as in FIG. 18 have been marked with similar reference numbers and duplicative descriptions have been omitted.

In semiconductor device 1C, the planarization process may be performed until the top surface 101TS of the substrate 101 is exposed. The layer of liner material 403 may be separated into multiple segments and may be referred to as a plurality of liner layers 401. The top surface 401TS of the plurality of liner layers 401 and the top surface 101TS of the protruding portion 101P (or the substrate 101) may be substantially coplanar.

One aspect of the present disclosure provides a semiconductor device including a substrate; an indentation inwardly positioned in the substrate and comprising a bottom surface and two sidewalls; a catalytic conductive layer positioned on the bottom surface of the indentation. The bottom surface of the indentation and a top surface of the substrate are parallel to each other. The two sidewalls of the indentation are substantially vertical.

Another aspect of the present disclosure provides a semiconductor device including a substrate; a first trench inwardly positioned in the substrate and comprising a bottom surface and two sidewalls; a catalytic conductive layer positioned on the bottom surface of the first trench; wherein the bottom surface of the indentation and a top surface of the substrate are parallel to each other. The two sidewalls of the first trench are substantially vertical. An aspect ratio of the first trench is between about 4:1 and about 12:1.

Another aspect of the present disclosure provides a method for fabricating a semiconductor device including providing a substrate; forming a catalytic conductive layer on the substrate; patterning the catalytic conductive layer to form an opening exposing an exposed portion of the substrate, while leaving a covered portion of the substrate covered by the catalytic conductive layer; performing a trench-etching process to recess the covered portion of the substrate, resulting in a first trench; removing the catalytic conductive layer; and forming an isolation layer in the first trench.

Due to the design of the semiconductor device of the present disclosure, the trench-etching process utilizing the catalytic conductive layer 200 does not generate massive by-products. Consequently, this eliminates the need for intensive cleaning post-processing, thereby reducing both the cost and complexity involved in fabricating the semiconductor device 1A.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:

a substrate;

an indentation inwardly positioned in the substrate and comprising a bottom surface and two sidewalls; and a catalytic conductive layer positioned on the bottom surface of the indentation;

wherein the bottom surface of the indentation and a top surface of the substrate are parallel to each other;

wherein the two sidewalls of the indentation are substantially vertical;

wherein two side surfaces of the catalytic conductive layer are parallel with each other and are in contact with the two sidewalls of the indentation;

wherein the catalytic conductive layer has a uniform thickness.

2. The semiconductor device of claim 1, wherein the catalytic conductive layer comprises gold, cobalt, chromium, copper, iron, hafnium, iridium, manganese, molybdenum, palladium, rubidium, rhenium, rhodium, tantalum, titanium, vanadium, tungsten, zinc, or zirconium.

3. The semiconductor device of claim 2, wherein the substrate comprises silicon, germanium, silicon germanium, silicon carbon, silicon germanium carbon, gallium, gallium arsenide, indium arsenide, or indium phosphorus.

4. The semiconductor device of claim 3, wherein an aspect ratio of the indentation is between about 4:1 and about 12:1.

5. The semiconductor device of claim 1, wherein the catalytic conductive layer comprises titanium nitride, wherein a thickness of the catalytic conductive layer is between 2 nm and 20 nm.

6. The semiconductor device of claim 1, wherein a crystal orientation of the substrate is <100>, <110>, or <111>, wherein a top surface of the catalytic conductive layer and the top surface of the substrate are parallel with each other.

7. A semiconductor device, comprising:

a substrate having two protruding portions;

a first trench inwardly positioned in the substrate and comprising a bottom surface and two sidewalls, wherein the first trench is formed between the two protruding portions; and a catalytic conductive layer positioned on the bottom surface of the first trench;

wherein the bottom surface of the first trench and a top surface each of the protruding portions of the substrate are parallel to each other;

wherein the two sidewalls of the first trench are substantially vertical;

wherein an aspect ratio of the first trench is between about 4:1 and about 12:1;

wherein two side surfaces of the catalytic conductive layer are parallel with each other and are in contact with the two sidewalls of the indentation;

wherein the catalytic conductive layer has a uniform thickness.

8. The semiconductor device of claim 7, wherein the catalytic conductive layer comprises gold, cobalt, chromium, copper, iron, hafnium, iridium, manganese, molybdenum, palladium, rubidium, rhenium, rhodium, tantalum, titanium, vanadium, tungsten, zinc, or zirconium.

9. The semiconductor device of claim 7, wherein the substrate comprises silicon, germanium, silicon germanium, silicon carbon, silicon germanium carbon, gallium, gallium arsenide, indium arsenide, or indium phosphorus.

10. The semiconductor device of claim 8, wherein the catalytic conductive layer comprises titanium nitride, wherein a thickness of the catalytic conductive layer is between 2 nm and 20 nm.

11. The semiconductor device of claim 8, wherein a crystal orientation of the substrate is <100>, <110>, or <111>, wherein a top surface of the catalytic conductive layer and the top surface of each of the protruding portions of the substrate are parallel with each other.

* * * * *